United States Patent
Hayami et al.

(10) Patent No.: US 8,286,581 B2
(45) Date of Patent: Oct. 16, 2012

(54) HIGH FREQUENCY POWER SOURCE AND ITS CONTROL METHOD, AND PLASMA PROCESSING APPARATUS

(75) Inventors: Toshihiro Hayami, Nirasaki (JP); Takeshi Ohse, Nirasaki (JP); Jun-Ichi Takahira, Niiza (JP); Jun-Ichi Shimada, Niiza (JP)

(73) Assignee: Tokyo Electron Limited, Tokyo (JP)

( * ) Notice: Subject to any disclaimer, the term of this patent is extended or adjusted under 35 U.S.C. 154(b) by 1242 days.

(21) Appl. No.: 10/864,538

(22) Filed: Jun. 10, 2004

(65) Prior Publication Data
US 2004/0222184 A1    Nov. 11, 2004

Related U.S. Application Data

(63) Continuation of application No. PCT/JP02/12937, filed on Dec. 10, 2002.

(30) Foreign Application Priority Data

Dec. 10, 2001 (JP) ................................. 2001-375639
Dec. 10, 2001 (JP) ................................. 2001-375961

(51) Int. Cl.
*H01L 21/00* (2006.01)
*C23C 16/00* (2006.01)

(52) U.S. Cl. .......... 118/723 R; 118/723 E; 118/723 AN; 118/723 I; 156/345.43; 156/345.44; 156/345.47; 156/345.48

(58) Field of Classification Search ............. 156/345.28, 156/345.43; 315/111.21
See application file for complete search history.

(56) References Cited

U.S. PATENT DOCUMENTS

| | | | |
|---|---|---|---|
| 4,579,618 A * | 4/1986 | Celestino et al. | 156/345.44 |
| 5,523,955 A | 6/1996 | Heckman | |
| 5,712,592 A | 1/1998 | Stimson et al. | |
| 5,770,922 A * | 6/1998 | Gerrish et al. | 315/111.21 |
| 6,332,961 B1 | 12/2001 | Johnson et al. | |
| 6,456,010 B2 * | 9/2002 | Yamakoshi et al. | 315/111.21 |
| 2002/0190808 A1 * | 12/2002 | Paquette et al. | 333/1.1 |

FOREIGN PATENT DOCUMENTS

| | | | |
|---|---|---|---|
| JP | 60-160620 | | 8/1985 |
| JP | 9-139377 | | 5/1987 |
| JP | 5-6799 | | 1/1993 |
| JP | 08162291 A | * | 6/1996 |
| JP | 09-139377 | | 5/1997 |
| JP | 2000-031073 | | 1/2000 |
| JP | 2000-315682 | | 11/2000 |
| JP | 2001-274099 | | 10/2001 |
| JP | 2002-110566 | | 4/2002 |
| JP | 2002-168892 | | 6/2002 |
| JP | 2003-017296 | | 1/2003 |
| JP | 2003-17296 | | 1/2003 |
| JP | 2003-204237 | | 7/2003 |

* cited by examiner

*Primary Examiner* — Ram N. Kackar
(74) *Attorney, Agent, or Firm* — Oblon, Spivak, McClelland, Maier & Neustadt, L.L.P.

(57) ABSTRACT

In a high-frequency power source, a malfunction is prevented by precisely removing harmonic components or a modulated wave component which develops while producing a plasma, and a proper high frequency power can be impressed on a plasma processing apparatus. The high-frequency power source includes a power monitor constituted of a directional coupler, a mixer, a 100 kHz low-pass filter, a low-frequency detector, and an oscillator. A 100 MHz high-frequency wave including modulated wave components and the like extracted by the directional coupler and 99.9 MHz high-frequency wave oscillated by the oscillator are added by the mixer. An output of the addition is converted by the low-frequency detector into 100 kHz, resulting in detection.

5 Claims, 7 Drawing Sheets

HIGH FREQUENCY POWER SOURCE AND ITS CONTROL METHOD, AND PLASMA PROCESSING APPARATUS

This application is a Continuation Application of PCT International Application No. PCT/JP02/12937 filed on Dec. 10, 2002, which designated the United States.

FIELD OF THE INVENTION

The present invention relates to a high frequency power source and its control method, and a plasma processing apparatus; and, more particularly, to a high frequency power source and its control method, and a plasma processing apparatus for performing a plasma processing on a semiconductor wafer.

BACKGROUND OF THE INVENTION

In a conventional fabrication process of a semiconductor device, there has been used a plasma processing apparatus in which a semiconductor wafer (hereinafter, referred to as "wafer" for short) is etched by generating high density plasma at a relatively low atmospheric pressure. For example, in a parallel flat plate type plasma processing apparatus, a pair of parallel flat electrodes, i.e., an upper electrode and a lower electrode is placed inside a plasma chamber. Then, a plasma processing gas is introduced into the corresponding chamber, and, at the same time, a high frequency power is applied to one of the upper and lower electrodes to form a high frequency electric field therebetween. As a result, a plasma of the plasma processing gas is generated by the high frequency electric field to perform a plasma processing such as an etching on a wafer.

In such a plasma processing apparatus, a high frequency power for plasma generation and a high frequency power for bias, which is used for attracting ions of the plasma, overlap with each other and are applied to the lower electrode simultaneously, so as to perform an etching efficiently. Specifically, a high frequency power source for plasma generation is coupled to the lower electrode through a matching circuit (hereinafter, referred to as "matching box") so as to apply the high frequency power for plasma generation, and, at the same time, a high frequency power source for bias is coupled to the lower electrode through the matching box so as to apply the high frequency power for bias, so that the two high frequency powers are overlapped with each other. The high frequency power for plasma generation is set to have a frequency of 100 MHz, taking a plasma generation efficiency into consideration. On the other hand, the high frequency power for bias is set to have a frequency of 3.2 MHz.

FIGS. 6A and 6B are graphs showing modulated wave spectrums of input and output in a conventional plasma processing apparatus, wherein FIG. 6A is for an incident wave and FIG. 6B is for a reflecting wave.

As shown in FIGS. 6A and 6B, harmonic components or modulated wave components corresponding to main frequencies of 100 MHz and 3.2 MHz, respectively, are developed during plasma generation in the plasma processing apparatus. The harmonic components or the modulated wave components appear in the vicinity of the main frequencies of the incident wave (Pf) and the reflecting wave (Pr), simultaneously. As a result, there occurs a malfunction of the matching box or the high frequency power source. Thus, the high frequency power source is provided with a power monitor for controlling the high frequency power by detecting the incident wave and the reflecting wave.

FIG. 7 is a schematic view showing an inner configuration of a power monitor in a conventional plasma processing apparatus.

As shown in FIG. 7, the power monitor has a directional coupler 300, a band pass filter 310 formed of an LC circuit, and a high frequency detector 320. The aforementioned harmonic components or the modulated wave components are removed by a detection circuit composed of the band pass filter 310 and the high frequency detector 320.

However, in the conventional high frequency power source having the above conventional detection circuit, the differences between frequencies of the main frequencies and the modulated wave components or the like included in the reflecting wave become small, if the difference between frequencies of the high frequency powers for plasma generation and bias corresponding to the incident waves becomes large. As a result, the modulated wave components or the like are not sufficiently attenuated by the band pass filter formed of the LC circuit, which may cause a malfunction of the high frequency power source since the modulated wave components are considered as the reflecting wave.

In addition, it is difficult to impress a proper high frequency power during plasma generation, in case where the modulated wave components or the like are not sufficiently attenuated.

Further in the conventional plasma processing apparatus, the reflecting wave (reflecting power: Pr) generated by the incident wave (incident power: Pf), which is outputted to the plasma chamber from the high frequency power source, is turned back from the plasma chamber by a variation in load impedance during plasma generation. Thus, in order to protect the high frequency power source from the corresponding reflecting wave, there has been employed a method for lowering the incident wave by detecting the reflecting wave or a method of providing a circulator between the high frequency power source and the plasma chamber to remove the reflecting wave. Particularly, the latter method is more efficient to insure an ignition margin during plasma generation, in case of the high frequency power source for plasma generation.

FIG. 8 depicts a block diagram showing a schematic configuration of a prior art plasma processing apparatus.

As shown in FIG. 8, a plasma processing apparatus 200 includes a plasma chamber 221 accommodating a wafer; a high frequency power source 226 for plasma generation; a matching box 222 made of a matching circuit for matching an input impedance of the plasma chamber 221 side with an output impedance of the high frequency power source 226 side such that the aforementioned reflecting wave becomes minimum; a power monitor 223 controlling a high frequency power by detecting an incident wave and a reflecting wave and supplying the combined power to the plasma chamber 221; a circulator 224 made of a magnetic material; and a dummy load 225 of a terminating resistance.

The high frequency power source 226 has a power monitor 227 performing the same function as the power monitor 223, and a plurality of power combiners 228 to 234 for combining and outputting powers. For example, the high frequency power source 226 outputs a high frequency power for plasma generation of 100 MHz and 3 kW as the incident wave.

The circulator 224 receives the incident wave Pf outputted from the high frequency power source 226 side and outputs pf' to the plasma chamber 221 side, while outputting the reflecting wave Pr turned back from the plasma chamber 221 side to the dummy load 225. The dummy load 225 serves to dissipate the reflecting wave outputted from the circulator 224.

In the plasma processing apparatus 200, the high frequency power source 226 is protected from the reflecting wave by the circulator 224 that prevents the reflecting wave generated from the plasma chamber 221 due to a variation in load impedance during plasma generation from returning to the high frequency power source 226 directly.

However, it has been required a large space for the processing apparatus since the circulator 224 and the dummy load 225 for large power need to be disposed outside the high frequency power source 226, in the prior plasma processing apparatus 200.

Further, when the incident wave (Pf) from the high frequency power source 226 passes through the circulator 224, it is attenuated slightly (ΔPf=Pf−Pf') due to a magnetic loss since the circulator 224 is made of a magnetic material. As a result, there has been a need for installing the power monitor 223 in front of the matching box 222 so as to precisely control the incident wave inputted to the plasma chamber 221 side.

SUMMARY OF THE INVENTION

It is, therefore, a first object of the present invention to provide a high frequency power source and its control method, and a plasma processing apparatus capable of preventing the high frequency power source from malfunctioning by precisely removing harmonic components or modulated wave components and impressing a proper high frequency power on a plasma processing apparatus.

It is a second object of the present invention to provide a high frequency power source and its control method, and a plasma processing apparatus capable of reducing a space required for installing the plasma processing apparatus, and, at the same time, for simplifying an overall configuration of the processing apparatus and preventing a loss of an incident wave.

In accordance with a first aspect of the present invention for achieving the first object, there is provided a high frequency power source, including: a high frequency power generator for generating a high frequency power for producing a plasma inside a chamber of a plasma processing apparatus; and a control unit for controlling the high frequency power by removing harmonic components and modulated wave components developed while producing the plasma from the high frequency power generated from the high frequency power generator, wherein the control unit converts the high frequency power generated from the high frequency power generator into a low frequency power of a specific frequency, and performs a wave detection on the basis of the low frequency power.

Further, for the high frequency power source in accordance with the first aspect, it is preferable that the control unit has a high frequency power output unit for outputting a first high frequency power from the high frequency power generated from the high frequency power generator; an oscillation unit for oscillating a second high frequency power having a different frequency from that of the outputted first high frequency power; a multiplication unit for multiplying the first high frequency power outputted by the high frequency output unit by the second high frequency power oscillated by the oscillation unit; and a detection unit for detecting the low frequency power having the specific frequency out of a high frequency power obtained by the multiplication unit.

Still further, for the high frequency power source in accordance with the first aspect, it is preferable that the detection unit has a high frequency attenuation unit for attenuating predetermined high frequency components out of the high frequency power obtained by the multiplication unit.

Still further, for the high frequency power source in accordance with the first aspect, it is preferable that the specific frequency is in a range from 10 Hz to 500 KHz.

In accordance with a second aspect of the present invention for achieving the first object, there is provided a controlling method of a high frequency power source having a high frequency power generator for generating a high frequency power for producing a plasma inside a chamber of a plasma processing apparatus and a control unit for controlling the high frequency power by removing harmonic components and modulated wave components developed during the plasma generation from the high frequency power generated from the high frequency power generator, the method including: a high frequency power outputting step for outputting a first high frequency power from the high frequency power generated from the high frequency power generator; an oscillating step for oscillating a second high frequency power having a different frequency from that of the outputted first high frequency power; a multiplying step for multiplying the first high frequency power outputted in the high frequency power outputting step by the second high frequency power oscillated in the oscillating step; an attenuating step for attenuating predetermined high frequency components out of a high frequency power obtained in the multiplying step; and a detecting step for detecting a low frequency power having a specific frequency.

In accordance with a third aspect of the present invention for achieving the second object, there is provided a high frequency power source, including: a power combining unit for combining at least two high frequency powers; and a control unit for controlling a high frequency power obtained by the power combining unit, wherein the high frequency power controlled by the control unit is supplied to a plasma processing apparatus as an incident power, and wherein the power combining unit has a branch unit for branching a reflecting power of the incident power supplied to the plasma processing apparatus and a consumption unit for consuming the reflecting power branched by the branch unit, wherein the branch unit combines at least two high frequency powers.

Further, for the high frequency power source in accordance with the third aspect, it is preferable that the branch unit includes at least two circulators made of ferrite and coupled to the control unit in parallel.

Still further, for the high frequency power source in accordance with the third aspect, it is preferable that the consumption unit includes resistances coupled to the circulators, respectively.

Still further, it is preferable that the high frequency power source in accordance with the third aspect includes a plurality of additional power combining units for combining at least two high frequency powers and supplying the combined power to the power combining unit.

In accordance with a fourth aspect of the present invention for achieving the first object, there is provided a high frequency power source, including: a high frequency power generator for generating a high frequency component for producing a plasma inside a chamber of a plasma processing apparatus; and a control unit for controlling the high frequency component by removing harmonic components and modulated wave components developed during the plasma generation from high frequency components having as a main frequency a first frequency generated from the high frequency power generator, wherein the control unit has an oscillation unit for oscillating a high frequency component of a second frequency, which is different from the first frequency, a multiplication unit for multiplying the high frequency components having as the main frequency the first frequency by the high frequency component of the second frequency, and a detection unit for converting an output from the multiplication unit into a high frequency component of a third frequency to detect same.

In accordance with a fifth aspect of the present invention for achieving the first object, there is provided a plasma processing apparatus, including: a chamber accommodating therein a substrate to be processed; and a high frequency power source for supplying a high frequency power to the chamber, wherein a plasma is produced inside the chamber by the high frequency power to perform a plasma processing on the substrate to be processed, wherein the high frequency power source has a high frequency power generator for generating the high frequency power to produce the plasma, a high frequency output unit for outputting a first high frequency power from the high frequency power generated from the high frequency power generator, an oscillation unit for oscillating a second high frequency power having a different frequency from that of the outputted first high frequency power, a multiplication unit for multiplying the first high frequency power outputted by the high frequency output unit by the second high frequency power oscillated by the oscillation unit, a high frequency attenuation unit for attenuating predetermined high frequency components out of a high frequency power obtained by the multiplication unit, a detection unit for detecting a low frequency power having a specific frequency, and a control unit for converting the high frequency power into the low frequency power having the specific frequency, removing harmonic components and modulated wave components on the basis of the low frequency power, and controlling the high frequency power.

In accordance with a sixth aspect of the present invention for achieving the second object, there is provided a plasma processing apparatus, including: a chamber accommodating therein a substrate to be processed; and a high frequency power source for supplying a high frequency power to the chamber, wherein a plasma is produced inside the chamber by the high frequency power to perform a plasma processing on the substrate to be processed, wherein the high frequency power source has a power combining unit for combining at least two high frequency powers, a control unit for controlling a high frequency power combined by the power combining unit, a supply unit for supplying the high frequency power controlled by the control unit as an incident power, a branch unit for branching a reflecting power of the incident power supplied to the plasma processing apparatus, and a consumption unit for consuming the reflecting power branched by the branch unit, wherein the branch unit combines at least two high frequency powers.

BRIEF DESCRIPTION OF THE DRAWINGS

FIG. 5 presents a view for explaining a method of combining powers in the power combiners of FIG. 4, FIGS. 6A and 6B provide views showing modulated wave spectrums of input and output in a prior art plasma processing apparatus, wherein

DETAILED DESCRIPTION OF THE PREFERRED EMBODIMENT

Hereinafter, preferred embodiments of the present invention will be described in detail with reference to the accompanying drawings.

Figure 1:
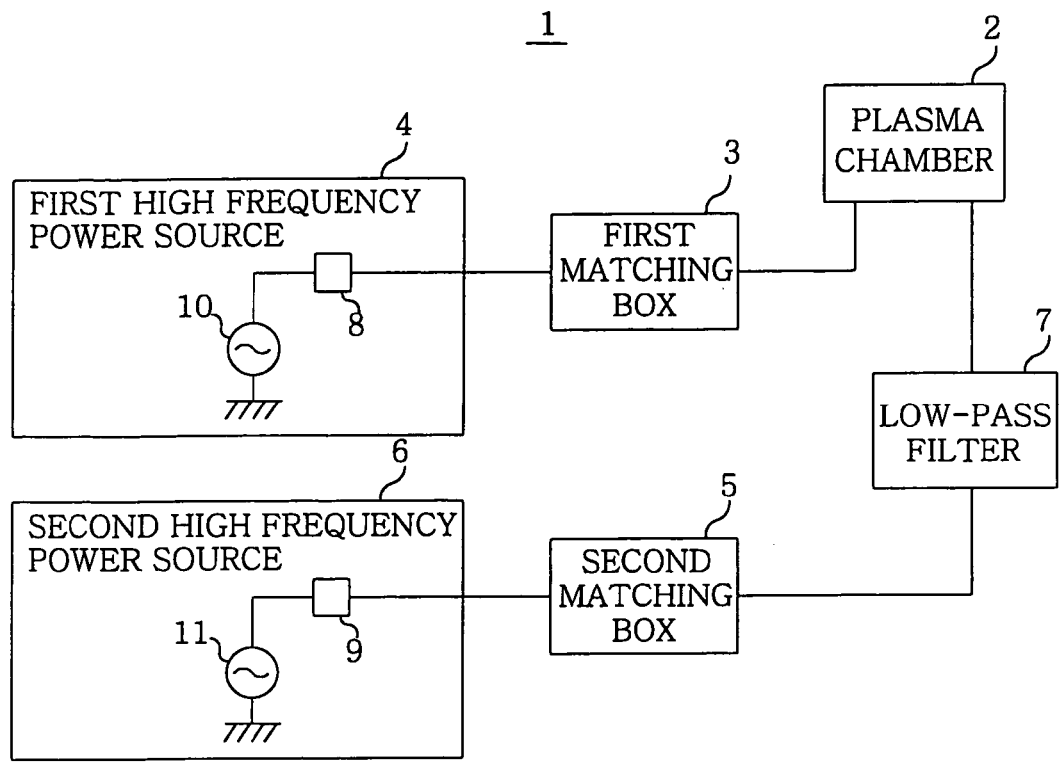
FIG. 1 offers a block diagram of an overall configuration of a plasma processing apparatus having a high frequency power source in accordance with a first preferred embodiment of the present invention.

FIG. 1 is a block diagram showing an overall configuration of a plasma processing apparatus having a high frequency power source in accordance with a first preferred embodiment of the present invention.

As shown in FIG. 1, a plasma processing apparatus 1 includes a plasma chamber 2 accommodating therein a substrate to be processed, e.g., a semiconductor wafer (hereinafter, referred to as "wafer" for short); a first matching box 3 coupled to an electrode (not shown) inside the plasma chamber 2; a first high frequency power source 4 coupled to the first matching box 3; a second matching box 5 coupled to the electrode inside the plasma chamber 2 through a low pass filter 7; and a second high frequency power source 6 coupled to the second matching box 5.

Further, the plasma processing apparatus 1 includes an exhaust unit (not shown) for maintaining an interior of the plasma chamber 2 at a predetermined depressurized state, and a gas inlet unit (not shown) for a plasma processing, which introduces a plasma processing gas into the plasma chamber 2 for producing a plasma.

The plasma processing apparatus 1 introduces the plasma processing gas into the plasma chamber 2 in which there is disposed a pair of parallel flat electrodes (not shown), i.e., an upper electrode (first electrode) and a lower electrode (second electrode) facing each other and, at the same time, applies a high frequency power to one of the upper and lower electrodes to form a high frequency electric field therebetween. Therefore, the plasma processing gas is converted into a plasma state by the high frequency electric field to perform a plasma processing such as an etching or the like on the substrate to be processed, i.e., the wafer.

The first high frequency power source 4 includes a power monitor 8 for controlling a high frequency power by detecting an incident wave (incident power: Pf) propagating to the plasma chamber 2 and a reflecting wave (reflecting power: Pr) returning from the plasma chamber 2 due to a variation in load impedance while producing a plasma; and a high frequency power generator 10 for generating a 100 MHz high frequency power. The first high frequency power source 4 controls the high frequency power generated from the high frequency power generator 10 by means of the power monitor 8 and outputs it to the first matching box 3 as a 100 MHz high frequency power for while producing a plasma.

The first matching box 3 includes an RF sensor (not shown) for detecting the 100 MHz high frequency power, and an LC circuit (not shown) having a variable capacitor, a coil, and the like. The first matching box 3 forms a matching circuit for matching a load impedance of the plasma chamber 2 side with a power source impedance of the first high frequency power source 4 side to thereby minimize the reflecting wave returning from the plasma chamber 2. In particular, a load impedance seen from the input side of the first matching box 3 is set to be equal (50Ω) to an impedance seen from the output side of the first high frequency power source 4.

The second high frequency power source 6 has a power monitor 9 for controlling the high frequency power by detecting the incident and reflecting waves described above; and a high frequency power generator 11 for generating a 3.2 MHz high frequency power of a different frequency from that of the high frequency power generated from the high frequency power generator 10. The second high frequency power source 6 controls the high frequency power generated from the high frequency power generator 11 by the power monitor 9, and outputs it to the second matching box 5 as a 3.2 MHz high frequency power for bias.

The second matching box 5 includes an RF sensor (not shown) for detecting the 3.2 MHz high frequency power, and an LC circuit (not shown) including a variable capacitor, a coil, and the like. The second matching box 5 is formed of a matching circuit for matching a load impedance of the plasma chamber 2 side with a power source impedance of the second high frequency power source 6 side to thereby minimize the reflecting wave returning from the plasma chamber 2. The low pass filter 7 serves to protect the second matching box 5 and the second high frequency power source 6 from the high frequency power having a main frequency of 100 MHz, which is turned back from the plasma chamber 2 as a reflecting wave and attenuate the corresponding reflecting wave.

On plasma processing, the high frequency power for producing a plasma, which is outputted from the first high frequency power source 4, and the high frequency power for bias, which is outputted from the second high frequency power source 6 and used for attracting ions during plasma discharging, overlap with each other and are applied to the lower electrode (not shown) inside the plasma chamber 2.

Figure 2:
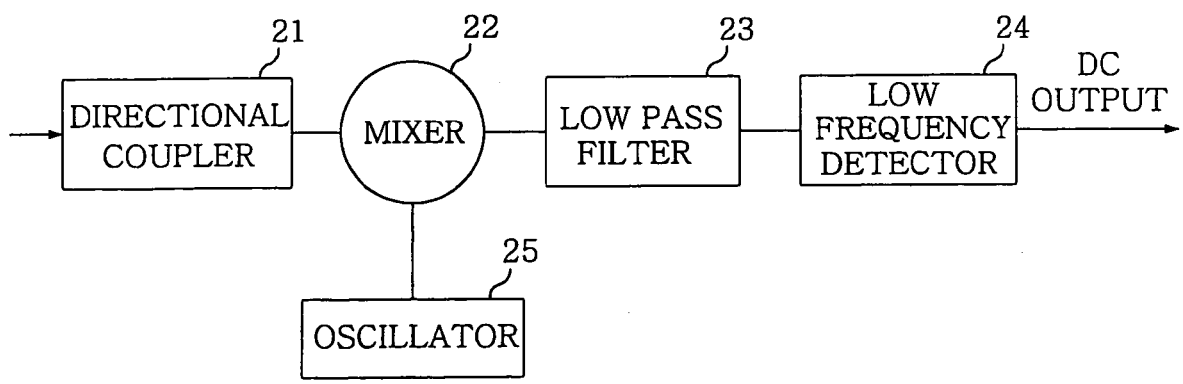
FIG. 2 shows a schematic view of an inner configuration of a power monitor in FIG. 1.

FIG. 2 shows a schematic view of an inner configuration of the power monitor 8 in FIG. 1.

As shown in FIG. 2, the power monitor 8 has a directional coupler 21; a mixer 22, i.e., a multiplifier (DBM: a double balanced mixer) containing with two inputs and one output; a 100 kHz low pass filter 23; a low frequency detector 24; and an oscillator 25 for oscillating a predetermined frequency. The power monitor 8 is a control unit for use in removing and detecting harmonic components and modulated wave components developed while producing a plasma, and, at the same time, applying a high frequency power of a predetermined frequency to the plasma chamber 2 when producing a plasma.

Figure 3:
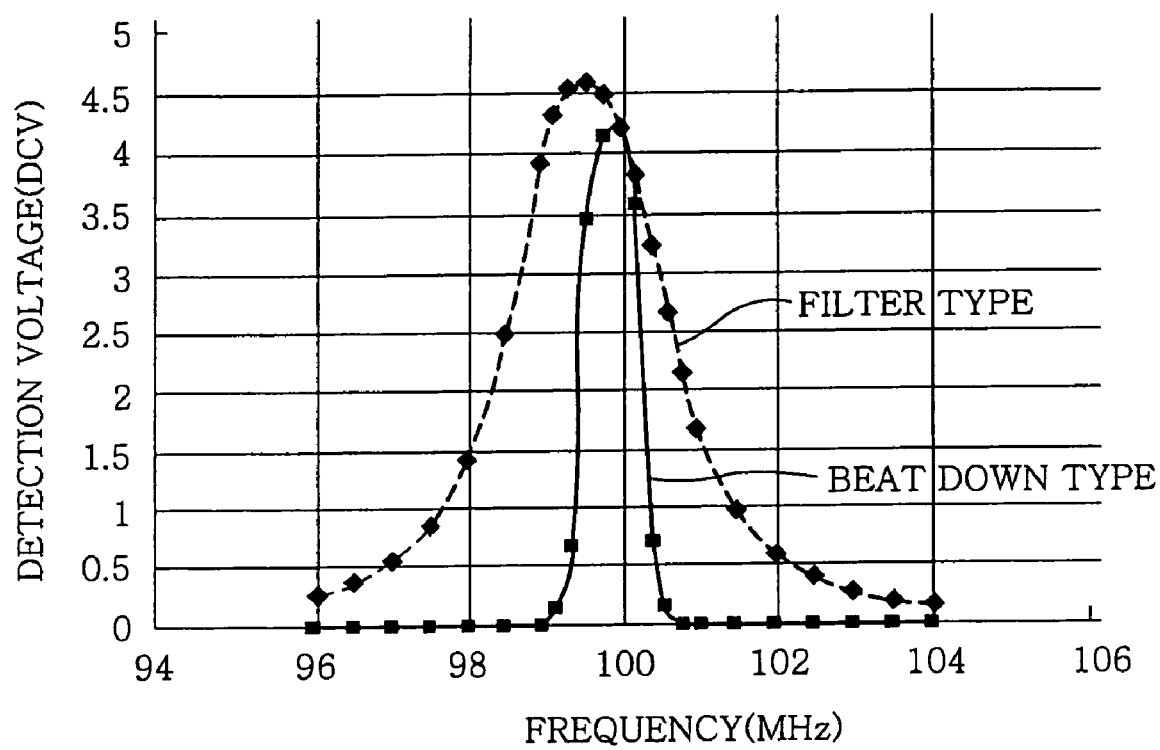
FIG. 3 shows a frequency characteristic of wave in the power monitor of FIG. 2 (beat down type) and that of a conventional detection (filter type), FIG. 4 sets forth a block diagram showing a schematic configuration of a plasma processing apparatus having a high frequency power source in accordance with a second preferred embodiment of the present invention.
Figure 7:
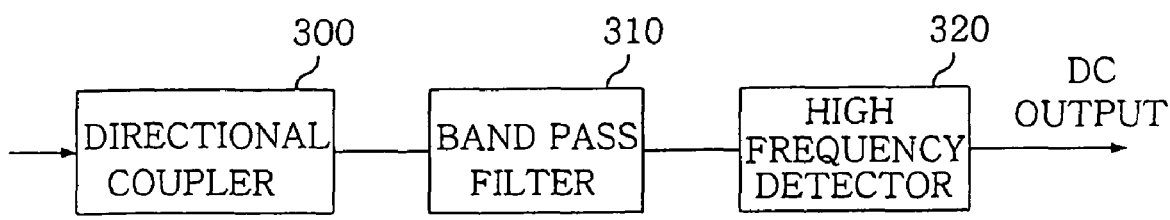
Figure 8:
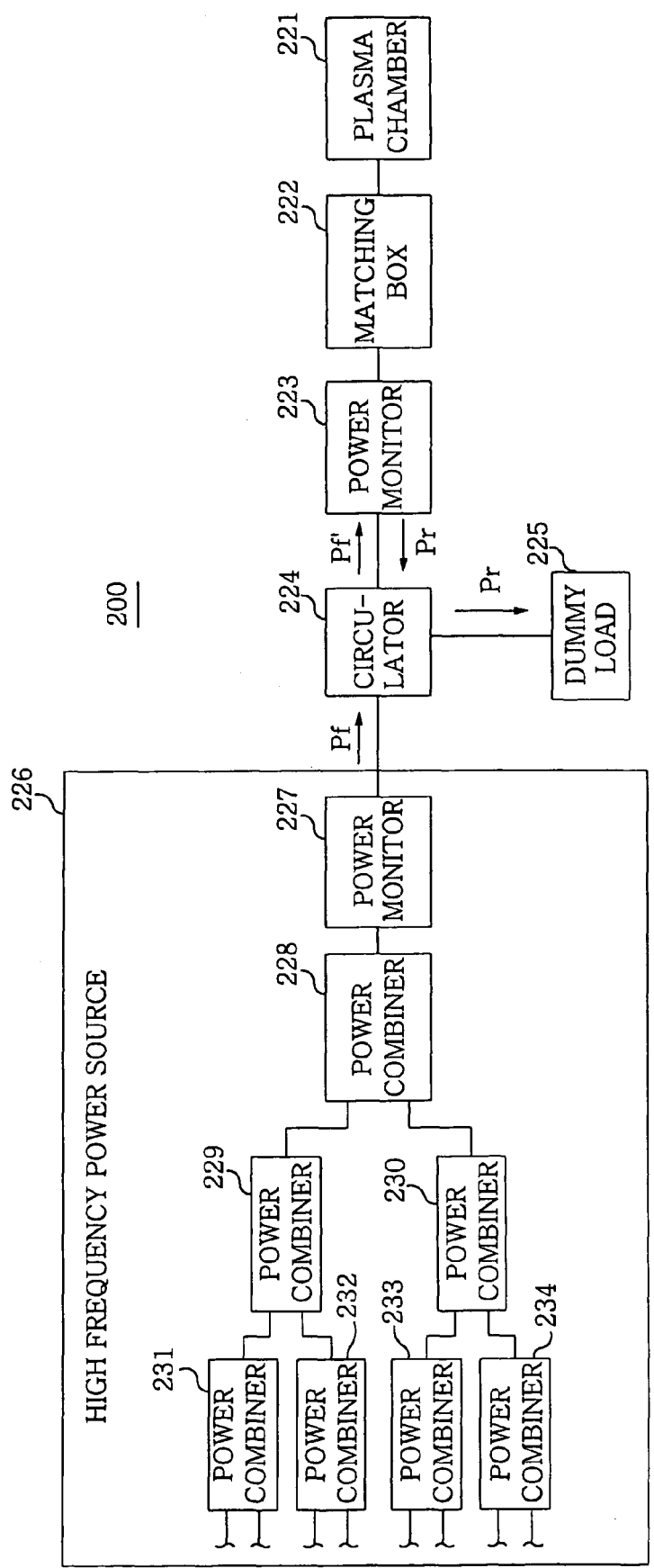
FIG. 8 depicts a block diagram showing a schematic configuration of a conventional plasma processing apparatus.

The directional coupler 21 outputs a high frequency power (high frequency components) having a main frequency of 100 MHz from high frequency powers inputted as an input to the mixer 22. In addition, the directional coupler 21 prevents the reflecting wave or the like from the plasma chamber 2 from propagating to the high frequency power generators 10 and 11 or the like. The oscillator 25 has an amplifier (not shown) or a frequency doubler (not shown), a 49.95 MHz crystal oscillator (not shown), or the like, and inputs a 99.9 MHz high frequency power (high frequency component) to the mixer 22. The mixer 22 multiplies the high frequency power outputted by the directional coupler 21 by the high frequency power inputted by the oscillator 25 to mix frequencies. The low pass filter 23 attenuates high frequency components in the output from the mixer 22. The low frequency detector 24 has an amplifier (not shown), a 100 kHz ideal detector (not shown), or the like, and detects a 100 kHz low frequency power (low frequency component) in the output from the low pass filter 23 to output same as a DC output (detection output). FIG. 3 shows a frequency characteristic detected by the power monitor 8 of FIG. 2 (beat down type) and that of a prior art detection (filter type) of FIG. 7.

Next, an operation of the power monitor 8 will be explained.

For example, the high frequency power with a main frequency of 100 MHz containing side band components of ±3.2 MHz, which are generated due to a modulation of a plasma load inside the plasma chamber 2, is inputted to the mixer 22 through the directional coupler 21. Meanwhile, the 99.9 MHz high frequency power from the oscillator 25 is inputted to the mixer 22. The mixer 22 multiplies the inputted high frequency powers, thereby outputting a high frequency power having frequency components such as 199.9±3.2 MHz, 0.1+ 3.2 MHz, and the like, to the low pass filter 23.

In the output from the mixer 22, the high frequency components having frequencies of 199.9±3.2 MHz or 0.1+3.2 MHz are attenuated and removed by the low pass filter 23 and the resultant power is outputted to the low frequency detector 24. The low frequency detector 24 outputs a 100 kHz (0.1 MHz) low frequency power, which is an output from the low pass filter 23, to an error amplification circuit (not shown) as a DC output. In the error amplification circuit, a DC voltage from the low frequency detector 24 is compared with a reference voltage for setting an output. In accordance with the comparison result, a comparative voltage is given to a high frequency amplifier (not shown) so as to control the output. Thus, the first high frequency power source 4 can be prevented from malfunctioning by precisely removing harmonic components or modulated wave components developed while producing a plasma. In addition, a proper high frequency power can be impressed on the plasma processing apparatus 1.

By selecting the 99.9 MHz high frequency power oscillated by the oscillator 25 against the high frequency power having the main frequency of 100 MHz in the high frequency powers, frequencies of the side band components contained in the high frequency power generated by a modulation of a plasma load inside the plasma chamber 2 are sufficiently separated from the cutoff frequency of the low pass filter 23. Therefore, it is possible to sufficiently remove the side band components even if the low pass filter 23 has a simple configuration. In addition, the modulated wave components can be removed by selecting for the cutoff frequency of the low pass filter 23 a sufficiently low value compared with the modulated frequencies, even in case where the frequencies of the modulated wave components are close to a main frequency.

In accordance with the first preferred embodiment, the high frequency power, having the main frequency of 100 MHz containing the modulated wave components and outputted by the directional coupler 21 is added to the 99.9 MHz high frequency power generated from the oscillator 25 by the mixer 22, and an output of the addition is converted into 100 kHz and detected by the low pass filter 23 and the low frequency detector 24. Therefore, the first high frequency power source 4 can be prevented from malfunctioning by precisely removing harmonic components or modulated wave components developed while producing a plasma and a proper high frequency power can be impressed on the plasma processing apparatus 1.

Further, the power monitor 8 in the first preferred embodiment converts the main frequency of 100 MHz in the high frequency power into 100 kHz and detects it, but it is not limited thereto. Other than 100 MHz, it may be possible to convert the main frequency, e.g., having 70 MHz or higher into 100 kHz and detect it. Further, as a detection frequency, a frequency other than 100 kHz, for example a frequency in a range from 10 Hz to 500 KHz may be employed. Moreover, it is preferable to select a frequency in a range from 15 Hz to 500 KHz, in case where a sufficiently rapid response speed is required in a control loop.

In addition, the matching circuits in the first matching box 3 and the second matching box 5 of the first preferred embodiment is composed of the variable capacitor and the coil, but a matcher disclosed in Japanese Patent Laid-open Publication No. 2001-118700 may be employed in case of applying a high frequency power of 70 MHz or higher.

Further, the power monitor 8 is embedded in the first high frequency power source 4, but it may be embedded instead in the first matching box 3. In that case, a phase detection circuit or an operation circuit in lieu of a detection circuit may be used as an RF sensor.

Figure 4:
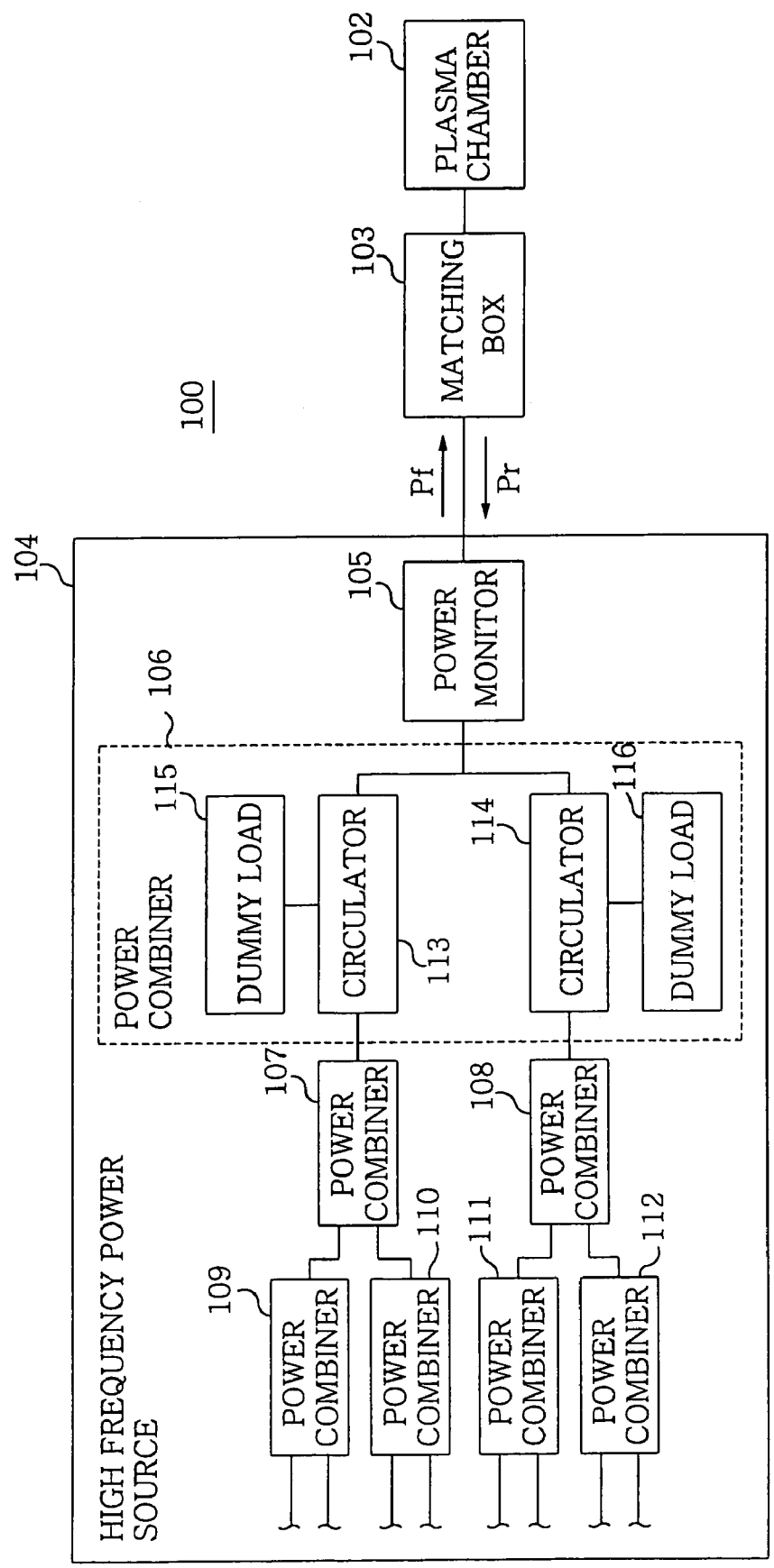

FIG. 4 sets forth a block diagram showing a schematic configuration of a plasma processing apparatus having a high frequency power source in accordance with a second preferred embodiment of the present invention.

As shown in FIG. 4, a plasma processing apparatus 100 includes a plasma chamber 102 accommodating therein a semiconductor wafer (hereinafter, referred to as "wafer" for short), a matching box 103 coupled to the plasma chamber 102, and a high frequency power source 104 for producing a plasma.

In addition, the plasma processing apparatus 100 includes an exhaust unit (not shown) for maintaining an interior of the plasma chamber 102 at a predetermined depressurized state, and a gas inlet unit for a plasma processing (not shown) which introduces a plasma processing gas for producing a plasma into the plasma chamber 102.

The plasma processing apparatus 100 introduces the plasma processing gas into the plasma chamber 102 in which there is disposed a pair of parallel flat electrodes (not shown), i.e., an upper electrode (first electrode) and a lower electrode (second electrode) facing each other and, at the same time, applies high frequency powers to one of the upper and lower electrodes to form a high frequency electric field therebetween by the high frequency power source 104. Therefore, the plasma processing gas is converted into a plasma state by the high frequency electric field to perform a plasma processing such as an etching or the like on a substrate to be processed, i.e., a wafer.

The matching box 103 has an LC circuit (not shown) including a variable capacitor, a coil, and the like, and is formed of a matching circuit for matching an input impedance of the plasma chamber 102 side with an output impedance of the high frequency power source 104 side. In particular, the impedance seen from the input side of the matching box 103 is set to be equal (50Ω) to that seen from the output side of the high frequency power source 104.

The high frequency power source 104 has a power monitor 105 for controlling high frequency powers by detecting an incident wave (incident power: Pf) propagating to the plasma chamber 102 and a reflecting wave (reflecting power: Pr) returning from the plasma chamber 102 due to a variation in load impedance while producing a plasma; and a plurality of power combiners 106 to 112 combining powers. The high frequency power source 104 outputs a high frequency power for producing a plasma of 100 MHz and 3 kW, as an incident wave.

For obtaining a large power by a high frequency power source, it is generally required to combine powers since an output of one amplifier is limited to approximately 200 to 300 W. Particularly, in case of outputting a high frequency power with 100 MHz and 3 kW, the number of power combiners is not limited that in the drawing, but the power combination can be done by coupling multiple stages of the plurality of power combiners 106 to 112.

The power combiners 107 to 112 are formed of Wilkinson type combiner. In contrast with the power combiners 107 to 112, the power combiner 106 includes circulators 113 and 114 made of ferrite (magnetic material) and dummy loads 115 and 116 of terminating resistances. In the power combiner 106, the circulators 113 and 114 are coupled to the power monitor 105 in parallel as shown to serve as the power combiner and outputs the combined outputs from the power combiners 107 and 108.

Figure 5:
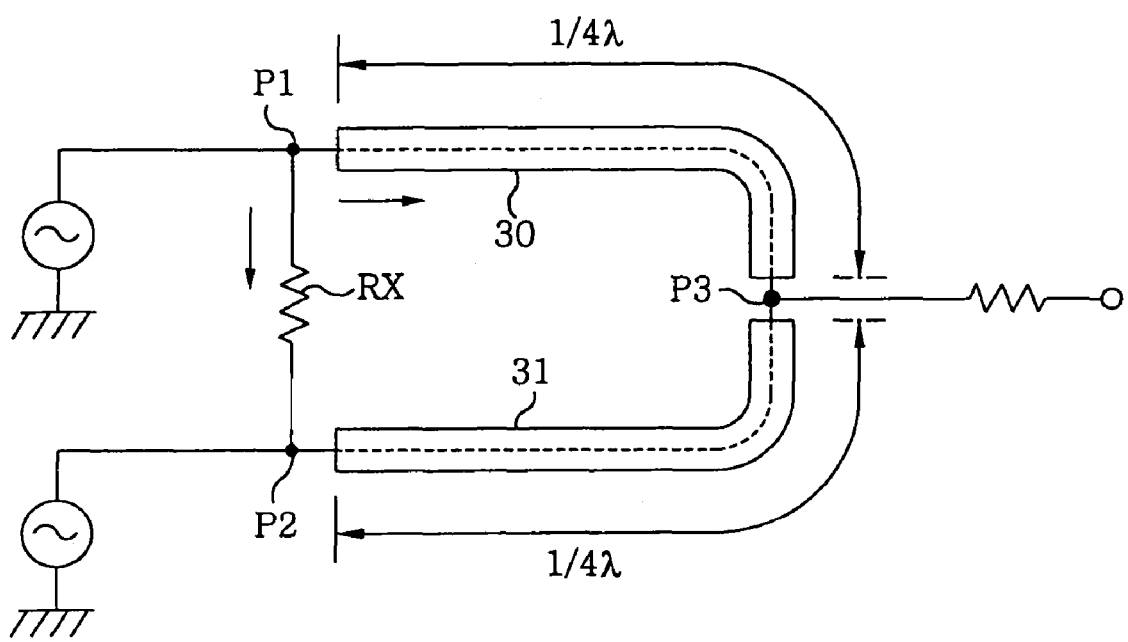
Figure 6A:
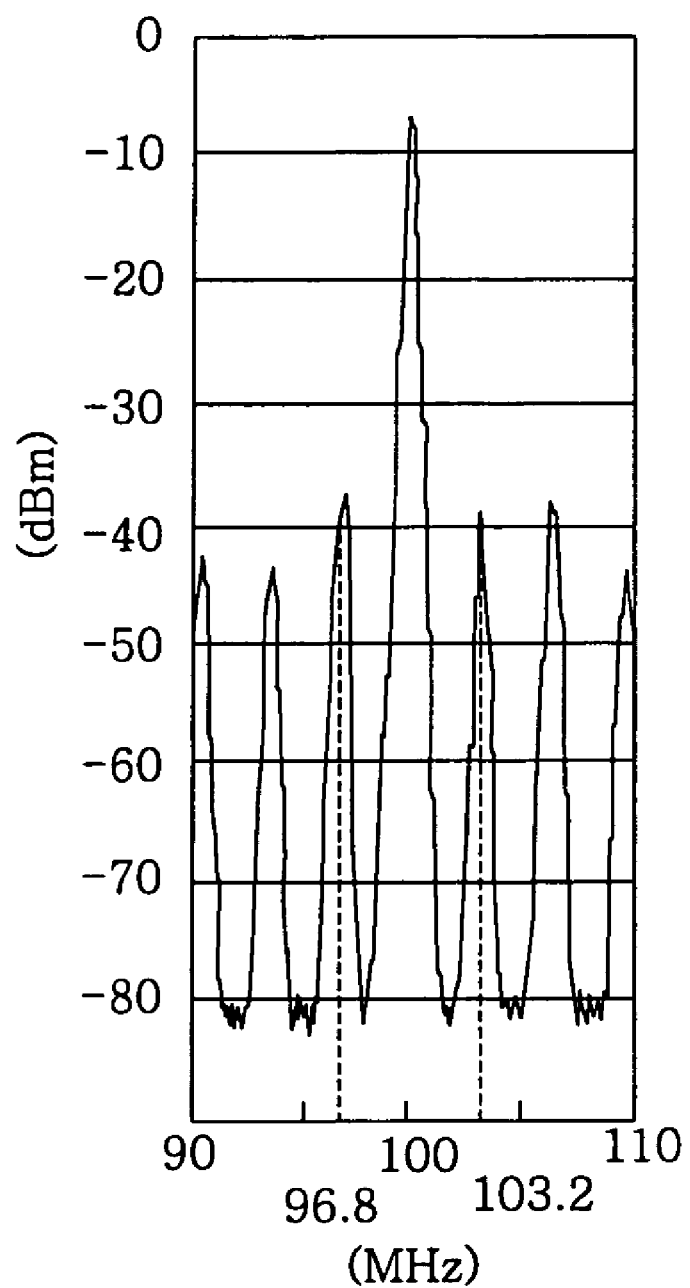
FIG. 6A is for an incident wave and FIG. 6B is for a reflecting wave, FIG. 7 describes a schematic view showing an inner configuration of a power monitor in a prior art plasma processing apparatus.
Figure 6B:
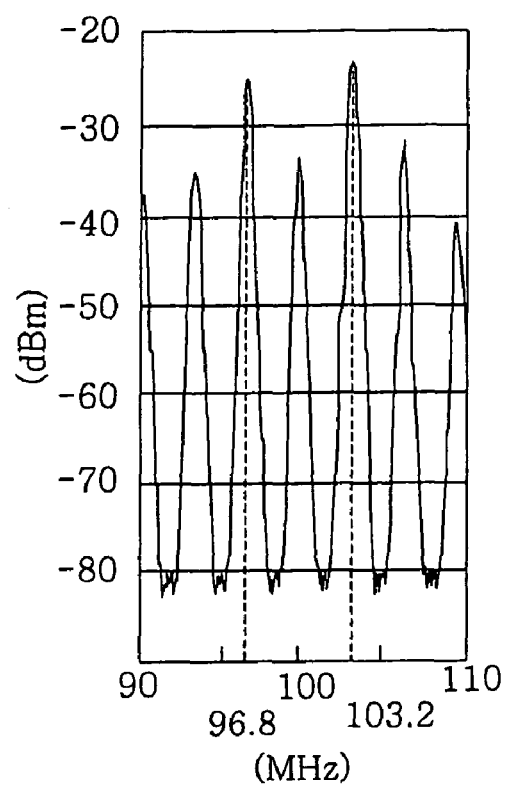

FIG. 5 presents a view for explaining a method of combining powers in power combiners 107 to 112 of FIG. 4. The method of combining powers is generally referred to as a Wilkinson type combining dividing method, which applies an impedance conversion by a coaxial cable of ¼ wavelength (¼λ).

In FIG. 5, reference numerals 30 and 31 indicate coaxial cables with an impedance of 70Ω at ¼λ. Reference numeral Rx is a resistance for keeping isolation between P1 and P2. As shown in drawing, it is possible to combine powers by coupling the power combiners 107 to 112.

Referring back to FIG. 4, the circulators 113 and 114 combine the high frequency powers inputted from the power combiners 107 and 108, and output the combined power to the power monitor 105 as an incident wave. In the mean time, the circulators 113 and 114 also output the reflecting wave returning from the plasma chamber 102 through the power monitor 105 to the dummy loads 115 and 116, by using the magnetic resonance phenomenon of ferrite. The reflecting wave outputted to the dummy loads 115 and 116 are dissipated by the respective resistances inside the dummy loads 115 and 116.

As described above, the reflecting wave generated from the plasma chamber 102 due to the variation in load impedance while producing a plasma is dissipated by the dummy loads 115 and 116 through the circulators 113 and 114. Therefore, it is possible to protect the high frequency power source 104 of a distal end from the reflecting wave and supply stable energy to the plasma chamber 102.

In case where the circulators 113 and 114 are disposed outside the high frequency power source 104, an output of the high frequency power source 104 becomes constant regardless of the state of the plasma chamber 102 functioning as a load. Thus, the power monitor 105 for controlling the incident wave should be placed at an input side of the matching box 103 to carry out power feedback with the main body of the high frequency power source 104. In the present embodiment, the incident wave can be processed inside the high frequency power source 104 by combining powers by using the circulators 113 and 114. Thus, an overall construction of the processing apparatus becomes simple.

In accordance with the second preferred embodiment, by the circulators 113 and 114 made of ferrite and contained in the power combiner 106 inside the high frequency power source 104, the reflecting wave from the plasma chamber 102 side is divided and outputted to the dummy loads 115 and 116, and then is dissipated by the corresponding dummy loads 115 and 116. Therefore, it is possible to reduce an installation space required for the plasma processing apparatus and simplify the overall configuration of the processing apparatus, while preventing a loss of an incident wave.

Further, the two circulators 113 and 114 in the power combiner 106 are coupled to the power monitor 105 in parallel, so that two high frequency powers can be combined and outputted without using a power combiner. In addition, the dummy loads 115 and 116 coupled to the circulators 113 and 114 can be equipped inside a cooling unit of a power amplifier (not shown) of the high frequency power source 104, so that a space for the processing apparatus can be reduced.

In the second preferred embodiment, the circulators 113 and 114 are installed separately, but they would be implemented as a single body.

In the first and the second preferred embodiment, the parallel flat plate type plasma processing apparatus 1 was explained, but it can be applied to plasma processing apparatus having various plasma sources, e.g., microwave plasma processing apparatus, ECR (electron cyclotron resonance) plasma processing apparatus, etc. Further, a substrate to be processed is not limited to the semiconductor wafer, and it can be applied to various substrates such as a glass substrate or the like.

INDUSTRIAL APPLICABILITY

As described above, for the high frequency power source in accordance with the first aspect of the present invention, the control unit converts the high frequency power generated from the high frequency power source into the low frequency power having a specific frequency, and performs a wave detection on the basis of the corresponding low frequency power. Therefore, the high frequency power source can be prevented from malfunctioning by precisely removing harmonic components or modulated wave components developed while producing a plasma, and a proper high frequency power can be impressed on the plasma processing apparatus.

In addition, the harmonic components or the modulated wave components developed while producing a plasma can be precisely removed by multiplying the first high frequency power outputted from the high frequency power by the second high frequency power having a different frequency from that of the outputted first high frequency power, and detecting a low frequency power having a specific frequency out of a multiplied high frequency power.

Further, the harmonic components or the modulated wave components can be removed by a simple filter since the specific frequency is in a range from 10 Hz to 500 KHz.

According to the controlling method in accordance with the second aspect of the present invention, the high frequency power source can be prevented from malfunctioning by precisely removing the harmonic components or the modulated wave components developed while producing a plasma, and a proper high frequency power can be impressed on the plasma processing apparatus, by multiplying the first high frequency power outputted from the high frequency power by the second high frequency power having a different frequency from that of the outputted first high frequency power, attenuating specific high frequency components out of a multiplied high frequency power, and detecting a low frequency power having a specific frequency out of the attenuated high frequency powers.

For the high frequency power source in accordance with the third aspect of the present invention, the branch unit branches the reflecting power to the incident power supplied to the plasma processing apparatus and the consumption unit dissipates the branched reflecting power, and the branch unit combines at least two high frequency powers, in the power combining unit for combining at least two high frequency powers. Therefore, it is possible to reduce a space required for installing the plasma processing apparatus, to simplify a configuration of the processing apparatus, and to prevent a loss of an incident wave.

In addition, the branch unit includes at least two circulators, which are made of ferrite and coupled to the control unit in parallel, so that two high frequency powers can be combined and outputted without using a power combiner.

Further, the consumption unit includes the resistances coupled to the circulators, respectively, whereby it can be equipped in the cooling unit of the power amplifier inside the high frequency power source, resulting in reducing a space required for the processing apparatus.

Still further, a desired high frequency power can be outputted since a plurality of additional power combining units, which combine at least two high frequency powers and supply the combined power to the power combining unit, are installed.

For the high frequency power source in accordance with the fourth aspect of the present invention, the control unit oscillates high frequency components containing the second frequency different from the first frequency; multiplies the high frequency components having a main frequency of the first frequency by the high frequency components having the second frequency; converts a multiplied output into high frequency components having a third frequency; and performs a wave detection. Therefore, the high frequency power source can be prevented from malfunctioning by precisely removing the harmonic components or the modulated wave components developed while producing a plasma, and a proper high frequency power can be impressed on the plasma processing apparatus.

For the plasma processing apparatus in accordance with the fifth aspect of the present invention, the high frequency power source converts frequencies of the high frequency powers into specific frequencies, and then, performs a wave detection by removing the harmonic components or the modulated wave components, whereby the high frequency power source can be prevented from malfunctioning by precisely removing the harmonic components or the modulated wave components developed while producing a plasma, and, at the same time, a proper high frequency power can be impressed on the plasma processing apparatus.

For the plasma processing apparatus in accordance with the sixth aspect of the present invention, the high frequency power source combines at least two high frequency powers, controls a combined high frequency power so as to branch the reflecting power to the incident power, and dissipates the branched reflecting power. In addition, the branch unit combines at least two high frequency powers. Thus, it is possible to reduce a space required for installing the processing apparatus, to simplify a configuration of the processing apparatus, and to prevent a loss of the incident wave.

What is claimed is:
1. A high frequency power source, comprising:
a power monitor;
a power combining unit for obtaining a combined high frequency power,
wherein the high frequency power source is provided with the power monitor to control the combined high frequency power obtained by the power combining unit,
wherein the high frequency power controlled by using the power monitor is supplied to a plasma processing apparatus as an incident power,
wherein the power combining unit includes a branch unit for combining a first and a second high frequency power to provide the combined high frequency power and branching a reflecting power of the incident power reflected from a plasma processing apparatus side and a consumption unit for consuming the reflecting power branched by the branch unit, wherein the branch unit includes a first and a second circulator, and the consumption unit includes dummy loads, each dummy load being coupled to the first and the second circulator, wherein the first and the second high frequency power are inputted into the first and the second circulator, respectively, and the first and the second circulator combine the first and the second high frequency power, wherein the reflecting power is branched at each of the first and the second circulator, and the branched reflecting power is dissipated by the dummy loads, and wherein the power monitor is located between the circulators and the plasma processing apparatus.

2. The high frequency power source of claim 1, wherein the first and the second circulator are made of ferrite and coupled to the control unit in parallel.

3. The high frequency power source of claim 2, comprising a plurality of additional power combining units for combining at least two high frequency powers and supplying the combined power to the power combining unit.

4. The high frequency power source of claim 1, comprising a plurality of additional power combining units for combining at least two high frequency powers and supplying the combined power to the power combining unit.

5. A plasma processing apparatus, comprising:
   a chamber accommodating therein a substrate to be processed; and
   a high frequency power source supplying a high frequency power to the chamber, wherein a plasma is produced inside the chamber by the high frequency power to perform a plasma processing on the substrate to be processed,
   wherein the high frequency power source includes:
      a power combining unit for obtaining a combined high frequency power,
      a power monitor for controlling the combined high frequency power obtained by the power combining unit,
      a supply unit for supplying the combined high frequency power controlled by using the power monitor as an incident power,
      a branch unit for combining a first and a second high frequency power to provide the combined high frequency power and branching a reflecting power of the incident power reflected from a plasma processing apparatus side, and
      a consumption unit for consuming the reflecting power branched by the branch unit,
      wherein the branch unit includes a first and a second circulator, and the consumption unit includes dummy loads, each dummy load being coupled to the first and the second circulator,
      wherein the first and the second high frequency power are inputted into the first and the second circulator, respectively, and the first and the second circulator combine the first and the second high frequency power,
      wherein the reflecting power is branched at each of the first and the second circulator, and the branched reflecting power is dissipated by the dummy loads, and
      wherein the power monitor is located between the circulators and the chamber.

* * * * *